(12) United States Patent
Meier et al.

(10) Patent No.: US 6,665,218 B2
(45) Date of Patent: Dec. 16, 2003

(54) SELF CALIBRATING REGISTER FOR SOURCE SYNCHRONOUS CLOCKING SYSTEMS

(75) Inventors: Peter J. Meier, Ft. Collins, CO (US); Gerald L Esch, Jr., Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 232 days.

(21) Appl. No.: 10/007,603

(22) Filed: Dec. 5, 2001

(65) Prior Publication Data

US 2003/0102892 A1 Jun. 5, 2003

(51) Int. Cl.[7] ................................................ G11C 7/00
(52) U.S. Cl. .................... 365/189.12; 365/194; 365/233
(58) Field of Search ........................... 365/189.12, 233, 365/194; 327/161, 158, 236, 291

(56) References Cited

U.S. PATENT DOCUMENTS

| | | | | |
|---|---|---|---|---|
| 6,118,319 A | * | 9/2000 | Yamada et al. | 327/291 |
| 6,329,854 B1 | * | 12/2001 | Lee et al. | 327/158 |
| 6,586,979 B2 | * | 7/2003 | Gomm et al. | 327/161 |

* cited by examiner

Primary Examiner—Son T. Dinh

(57) ABSTRACT

A self calibrating register. In representative embodiments, registers for increasing source synchronous input/output (I/O) data rates by counteracting the inherent systematic sources of system mismatch are disclosed. Systematic sources of system mismatch between bit-line paths and devices, as for example printed circuit board path lengths, package trace lengths, on-chip clock routing, clock skew, device turn-on voltages, etc. are balanced out with respect to a reference clock signal by programmed delays of the data signals. The appropriate delays are obtained via phase shift detection circuitry and are then applied by control circuitry to signal delay circuitry.

9 Claims, 6 Drawing Sheets

SELF CALIBRATING REGISTER FOR SOURCE SYNCHRONOUS CLOCKING SYSTEMS

FIELD OF THE INVENTION

The present invention relates generally to source synchronous input/output systems and, more particularly, to techniques for increasing the bandwidth of such systems.

BACKGROUND OF THE INVENTION

A key parameter in limiting the performance of modern computer and network systems is the speed at which data can be reliably transferred between system components. As these systems become faster and faster, it becomes more and more important to increase input/output (I/O) rates. The particular techniques used to address this issue depend in large part upon the transmission scheme.

In one such scheme, source synchronous I/O for parallel bus systems, data rates can be greatly increased when source clock and source data have a fixed, known relationship to each other. In source synchronous I/O systems, the clock signal generated in the transmitting device is sent to the receiving device along with the data signal. The data signal is transmitted in synchronization with the clock and historically was only allowed to transition on either the rising or falling edge of the clock. However, in the more recently developed double data rate (DDR) systems, one bit of data is transmitted on each rising edge of the clock and one bit on each falling edge.

Inherent fixed system mismatches, such as board trace length differences, package trace length differences, on-chip clock routing differences, clock skew, etc. are generally minimized in an attempt to increase I/O data rates. However, in these parallel transmission systems some fixed mismatch always remains between the various input/output parallel paths with an associated limit in attainable data rates. In addition, processing variations can cause changes in clock timing, data bit transition levels, and other rate related parameters.

Other time variant mismatches can also occur. These mismatches might be caused by environmental changes, device parameter drifts, as well as other causes. One particularly important environmental parameter for which a change could result in additional timing mismatches, device parameter shifts, and other changes is temperature. Supply voltage differences from system to system, between transmitting and receiving device, between receiving devices, as well as shifts over time can also result in mismatches. Degradation of device parameters, as for example MOSFET threshold voltage, which can occur over time can also result in mismatches by causing various switching devices to transition at different signal levels. These items can result in further small phase shifts of the received data signal with respect to the clock signal with subsequent decrease in data transmission rate. The reduction in reliable data transmission rate is due to the fact that the switching rate must permit the bit values on all bit-lines to reach stable values during each half clock cycle.

Thus, there is a need for a device which increases source synchronous I/O data rates by counteracting the inherent sources of system mismatches.

SUMMARY OF THE INVENTION

In representative embodiments, self calibrating registers which can increase source synchronous input/output (I/O) data rates by counteracting the inherent systematic sources of system mismatch are disclosed. Systematic sources of system mismatch between bit-line paths and devices, as for example printed circuit board path lengths, package trace lengths, on-chip clock routing, clock skew, device turn-on voltages, etc. are balanced out with respect to a reference clock signal by controlled delays of the data signals. Earlier techniques for reducing these mismatches have done so during the design stage and have had only limited success.

Embodiments disclosed herein disclose techniques whereby appropriate delays are obtained via phase shift detection circuitry and are then applied interactively by control circuitry to signal delay circuitry. Thus as is demonstrated herein, those delays which are difficult or impossible to design out can be compensated for following fabrication.

Calibration of the register is typically occurs at start-up. Additional re-calibration can be scheduled at other times to compensate for time dependent variations as, for example, caused by temperature changes.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and.

DETAILED DESCRIPTION OF THE PREFERRED EMBODIMENTS

Figure 1:
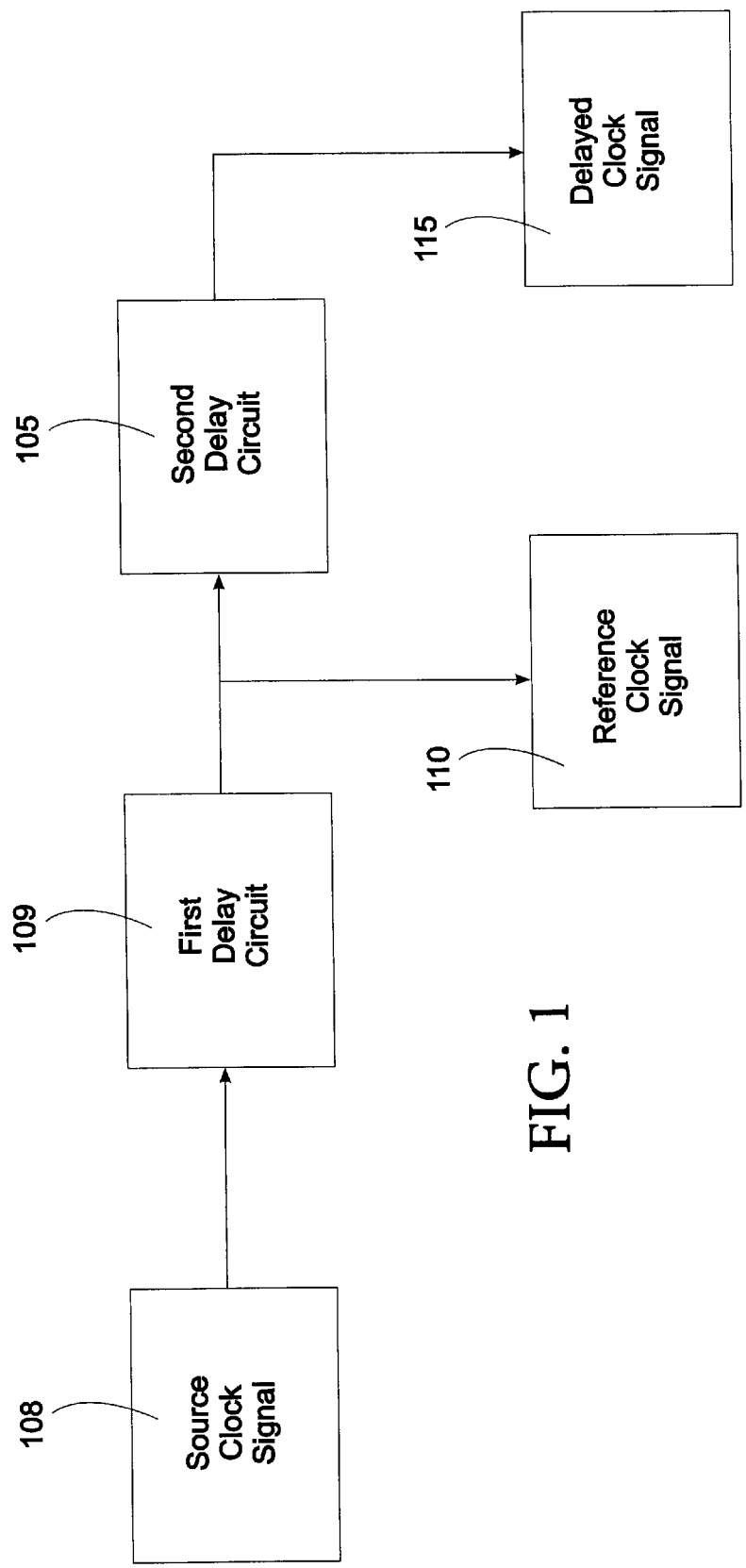
FIG. 1 is a drawing of a first and second clock-delay circuits as described in various representative embodiments of the present patent document.

As shown in the drawings for purposes of illustration, the present patent document relates to a novel device for increasing source synchronous input/output (I/O) data rates by counteracting the inherent systematic sources of system mismatch. Previous techniques for counteracting such mismatches have relied upon designing the system such that differences between bit-line paths and devices are kept to a minimum. Particular attention has been paid to matching items such as printed circuit board path lengths, package trace length differences, on-chip clock routing differences, clock skew, device turn-on voltages, etc. In spite of this care in design, variations in these characteristics still exist in actual applications.

In the following detailed description and in the several figures of the drawings, like elements are identified with like reference numerals.

1. Overview:

In representative embodiments, a self calibrating setup and hold circuit for use in source synchronous I/O systems is disclosed. Delays are introduced into the clock signal obtained from the data source and into the data signal for each data bit receiver. Inherent fixed system mismatches, such as board trace length differences, package trace length differences, on-chip clock routing differences, clock skew, parameter variations due to processing, etc. are first calibrated out. Other mismatches due to operational changes, as for example temperature and voltage, can also be calibrated out of the system by periodic re-calibration. Calibration is effected by first detecting the phase difference between clock and data signals. The delay on the data signal is interactively changed to null out the phase difference.

2. Clock Delay:

FIG. 1 is a drawing of a first and second clock-delay circuits 109,105 as described in various representative embodiments of the present patent document. The first clock-delay circuit 109 receives a source clock signal 108 and outputs a reference clock signal 110. The second clock-delay circuit 105 receives the reference clock signal 110 and outputs a delayed clock signal 115. In typical applications, the delayed clock signal 115 is delayed by one-quarter of the clock period with respect to the reference clock signal 110. The delay of the reference clock signal 110 with respect to the source clock signal 108 will be discussed in the following.

Figure 2:
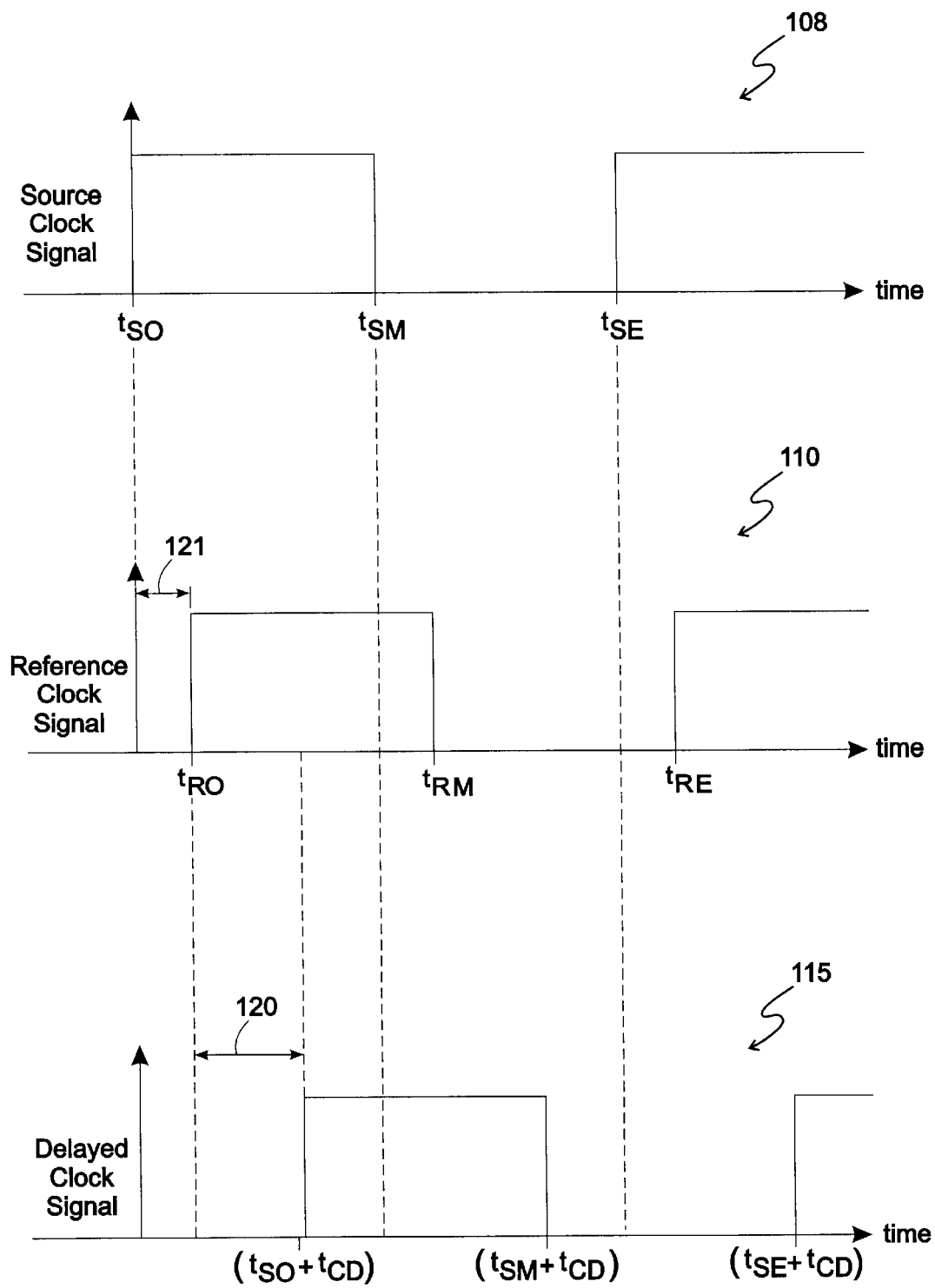
FIG. 2 is a drawing of timing diagrams for the clock-delay circuits as described in various representative embodiments of the present patent document.

FIG. 2 is a drawing of timing diagrams for the clock-delay circuits 109,105 as described in various representative embodiments of the present patent document. Shown in the top diagram of FIG. 2 is the source clock signal 108 plotted on the vertical axis vs. time on the horizontal axis. A cycle of the source clock signal 108 starts at time $t_{SO}$ with a transition from its low value to its high value, transitions back to its low value at time $t_{SM}$, and ends its cycle at time $t_{SE}$ just at the next transition of the source clock signal 108 from its low value to its high value. The source clock signal 108 referred to is the clock signal generated elsewhere, as for example in the source or transmitting device, but as received by the first clock-delay circuit 109.

Shown in the middle diagram of FIG. 2 is the reference clock signal 110 plotted on the vertical axis vs. time on the horizontal axis. The source clock signal 108 is delayed a first clock delay time 121 by the first clock-delay circuit 109 to obtain the reference clock signal 110. A cycle of the reference clock signal 110 starts at time $t_{R0}$ with a transition from its low value to its high value, transitions back to its low value at time $t_{RM}$, and ends its cycle at time $t_{RE}$ just at the next transition of the reference clock signal 110 from its low value to its high value.

Shown in the lower diagram of FIG. 2 is the delayed clock signal 115 plotted on the vertical axis vs. time on the horizontal axis. The reference clock signal 110 is delayed a second clock delay time 120, also referred to herein as a second delay time 120, by the second clock-delay circuit 105 to obtain the delayed clock signal 115. As previously stated, for typical applications the delayed clock signal 115 is delayed by one-quarter of the clock period with respect to the reference clock signal 110. One cycle of the delayed clock signal 115 starts at time $(t_{SO}+t_{CD})$ with a transition from its low value to its high value, transitions back to its low value at time $(t_{SM}+t_{CD})$, and ends its cycle at time $(t_{SE}+t_{CD})$ just at the next transition of the reference clock signal 110 from its low value to its high value.

Figure 3:
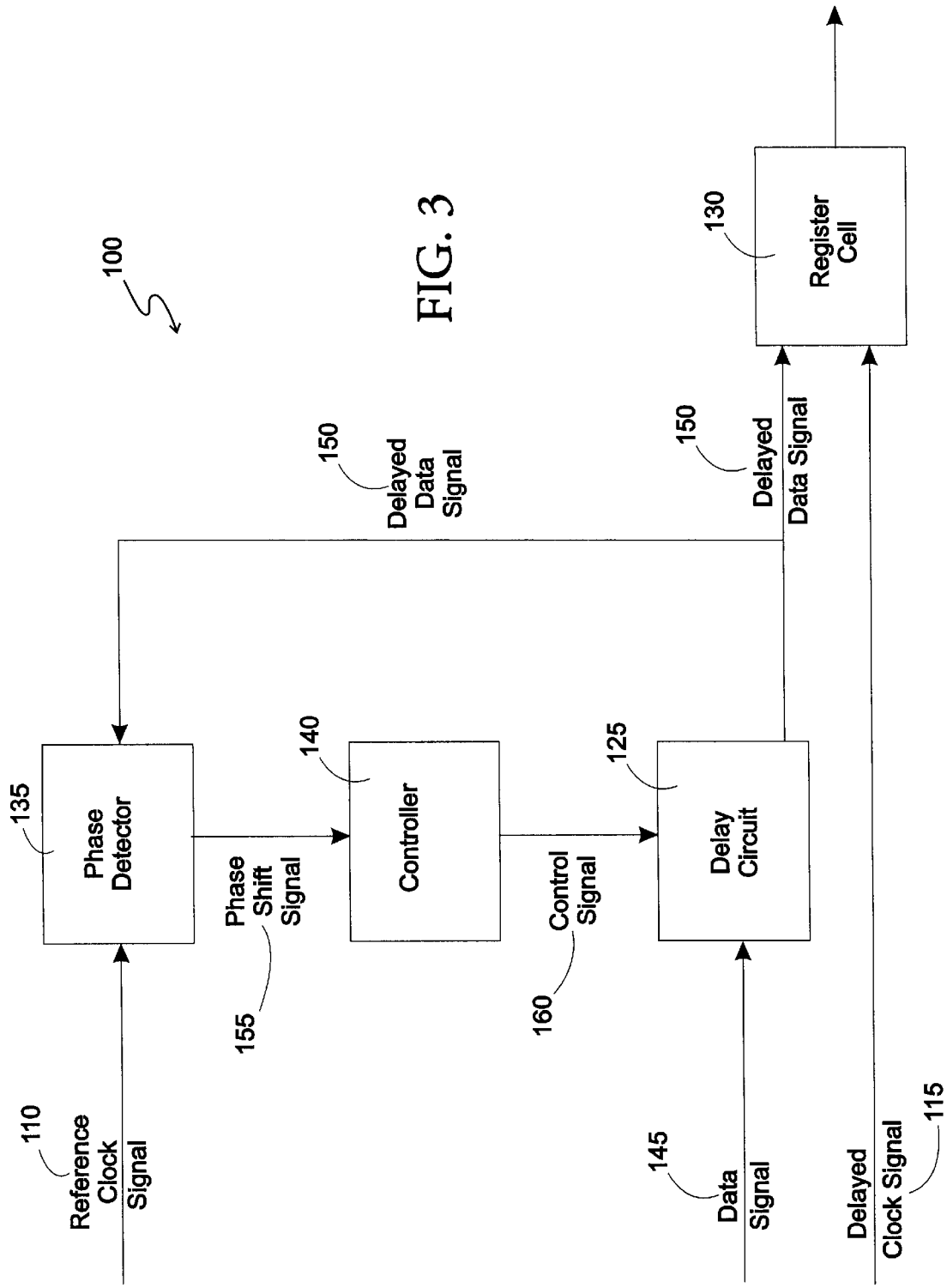
FIG. 3 is a drawing of a register as described in various representative embodiments of the present patent document.

3. Calibration:

FIG. 3 is a drawing of a register 100 as described in various representative embodiments of the present patent document. In FIG. 3, the register 100 comprises a delay circuit 125, a register cell 130, a phase detector 135, and a controller 140. The delay circuit 125 receives a data signal 145 and outputs a delayed data signal 150. The register cell 130 receives the delayed data signal 150 and the delayed clock signal 115. Transition from one data state to another in the register cell 130 is enabled at the leading and trailing transitions of the delayed clock signal 115 which, once again, occurs at times $(t_{SO}+t_{CD})$ and $(t_{SM}+t_{CD})$. At times $(t_{SO}+t_{CD})$ and $(t_{SM}+t_{CD})$ the delayed data signal 115 represents a relatively solid value as it is not near its transition times.

The phase detector 135 receives the reference clock signal 110 and the delayed data signal 150. The phase detector 135 detects the phase difference between these two signals and outputs the difference as a phase shift signal 155 to the controller 140. The controller 140 receives the phase shift signal 155. In turn, the controller 140 outputs a control signal 160 to the delay circuit 125 which instructs the delay circuit 125 to incrementally increase or decrease the time which the data signal 145 is delayed in transiting the delay circuit 125. This incremental change is made in order to reduce the phase shift between the reference clock signal 110 and the delayed data signal 150.

Figure 4:
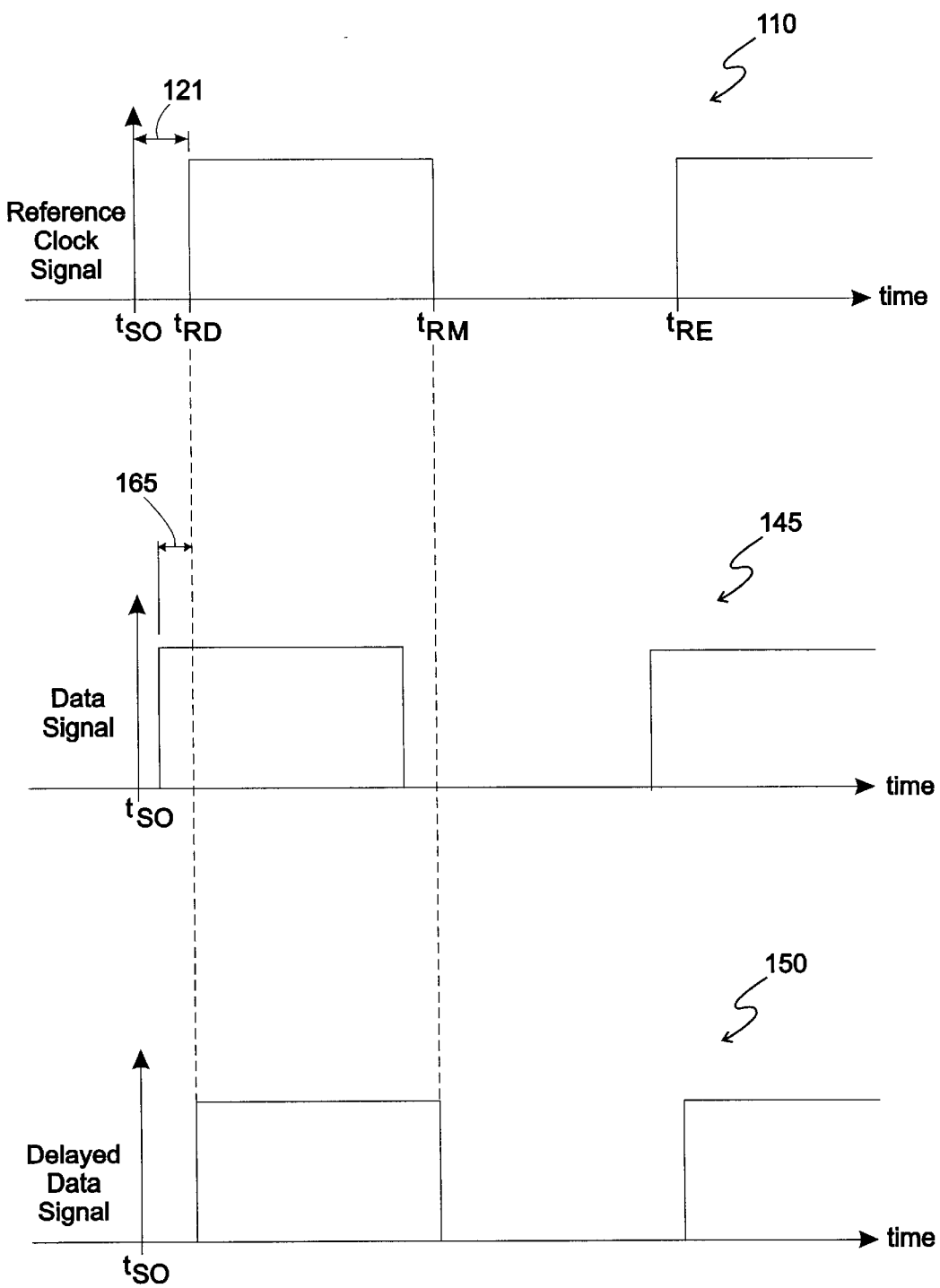
FIG. 4 is a drawing of timing diagrams for the clock signal and the delayed data signal as described in various representative embodiments of the present patent document.

FIG. 4 is a drawing of timing diagrams for the reference clock signal 110 and the delayed data signal 150 as described in various representative embodiments of the present patent document. Shown in the top diagram of FIG. 4 is the reference clock signal 110 plotted on the vertical axis vs. time on the horizontal axis. As previously described, one cycle of the reference clock signal 110 starts at time $t_{R0}$ with a transition from its low value to its high value, transitions back to its low value at time $t_{RM}$, and ends its cycle at time $t_{RE}$ just at the next transition of the reference clock signal 110 from its low value to its high value. Shown in the middle diagram of FIG. 4 is the data signal 145 plotted on the vertical axis vs. time on the horizontal axis. Shown in the lower diagram of FIG. 4 is the delayed data signal 150 plotted on the vertical axis vs. time on the horizontal axis. One cycle of the data signal 145 starts at a first delay time 165 before or after a transition edge of the reference clock signal 110. During the calibration phase, the controller 140 in conjunction with the phase detector 135 iteratively adjusts the delay circuit 125 until the delayed data signal 150 and the reference clock signal 110 are edge aligned as shown in FIG. 4.

Each bit-line of the parallel bus implementation is replicated by the number of bits to be transmitted in one data cycle and therefore received in parallel. The calibration process continues iteratively through a number of clock cycles until all controllers 140 contain a proper calibration control value indicating that the reference clock signal 110 and delayed data signals 150 are edge aligned at their associated phase detectors 135.

Figure 5:
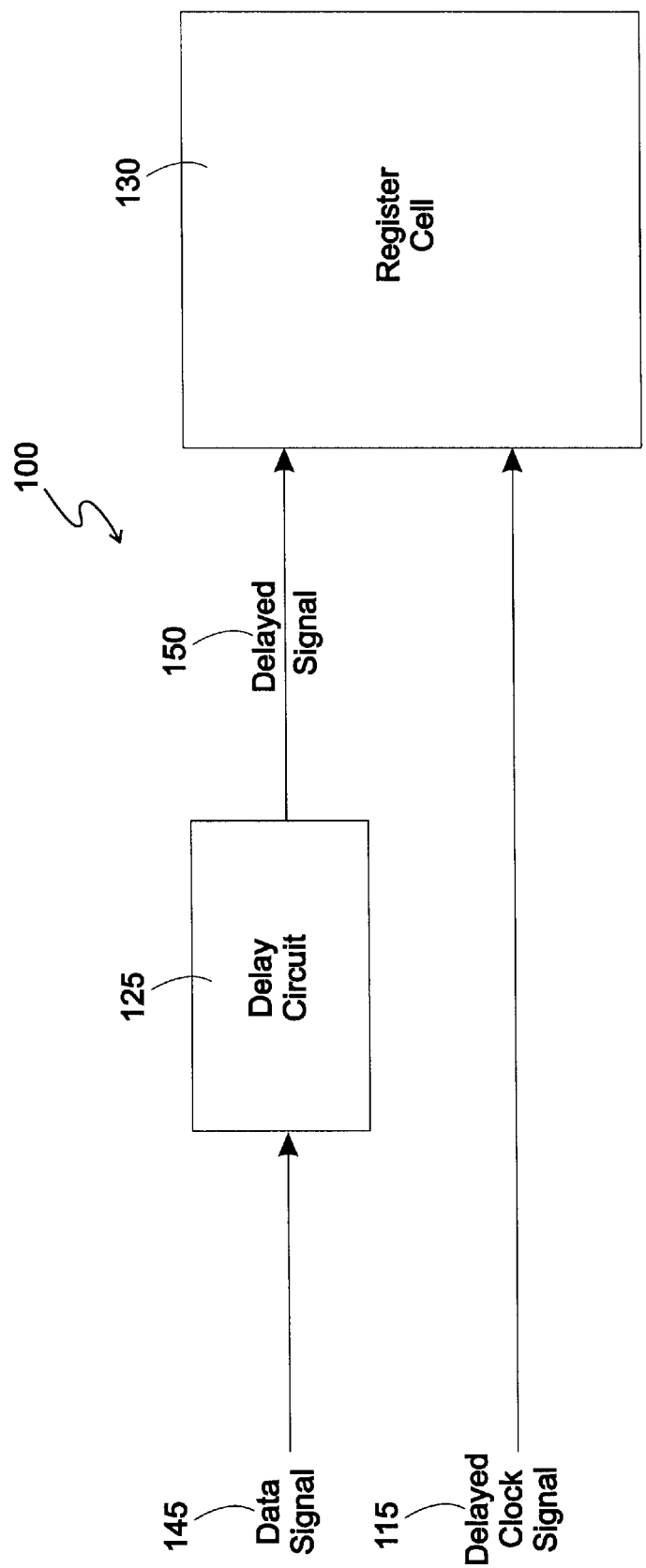
FIG. 5 is another drawing of the register as described in various representative embodiments of the present patent document.

4. Operating Configuration:

FIG. 5 is another drawing of the register 100 as described in various representative embodiments of the present patent document. In FIG. 5 which represents the operating configuration following calibration, the register 100 comprises the delay circuit 125 and the register cell 130. The delay circuit 125 receives the data signal 145 and outputs the delayed data signal 150, wherein the delayed data signal 150 is the data signal 145 delayed by a time period equal to the first delay time 165. The register cell 130 receives the delayed data signal 150 and the delayed clock signal 115. The delayed clock signal 115 is obtained by delaying the reference clock signal 110 by the second delay time 120 as indicated in FIGS. 1 and 2. The delay circuit 125 delays the data signal 145 by the first clock delay time 121 such that the reference clock signal 110 and the delayed data signal 150 are edge aligned. The delay of the reference clock signal 110 with respect to the source clock signal 108 is set to allow this edge alignment to occur. As previously stated, each bit-line of the parallel bus implementation is replicated by a number equal to the number of bits to be transmitted and therefore received in parallel.

Figure 6:
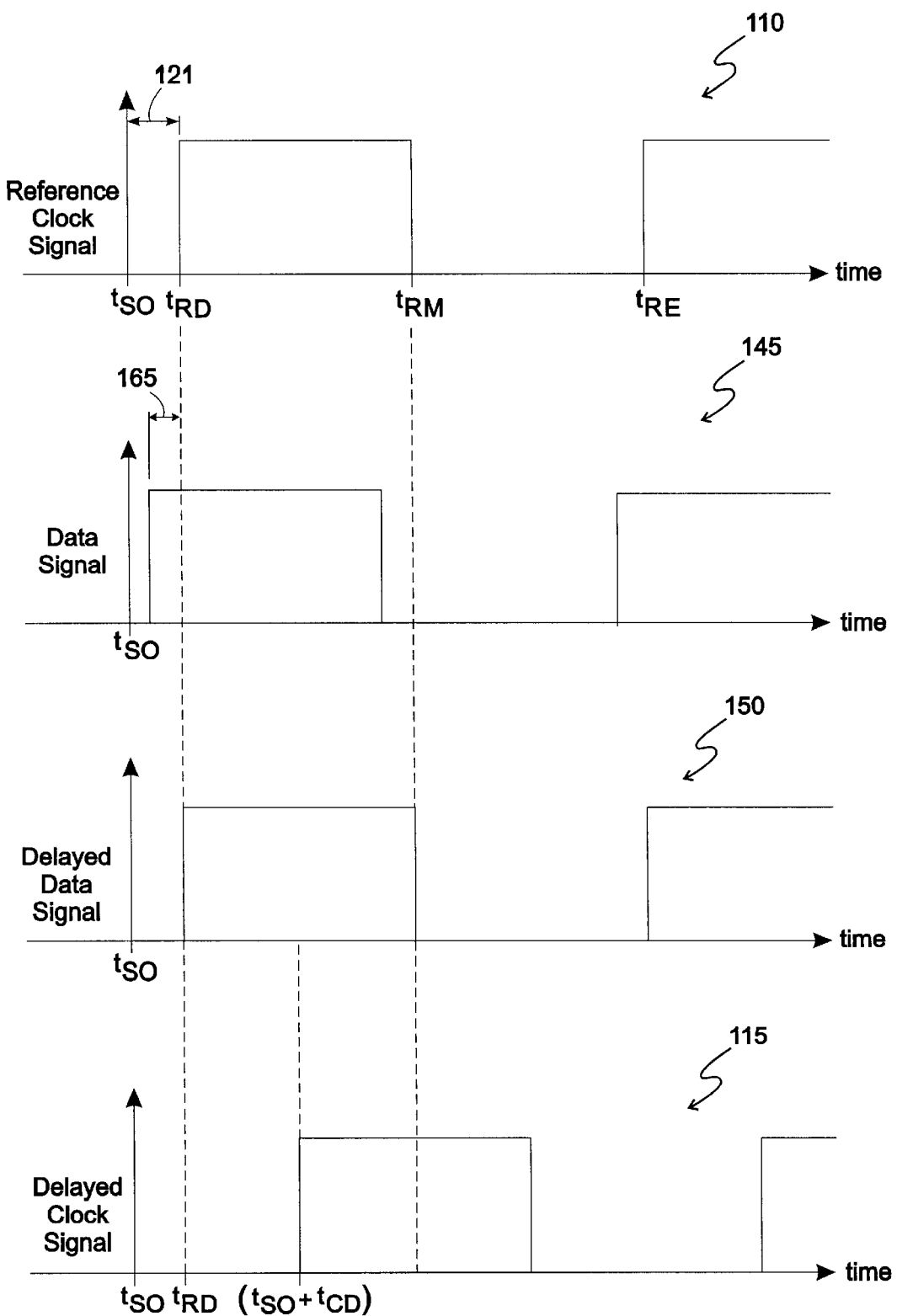
FIG. 6 is a drawing of timing diagrams for the register as described in various representative embodiments of the present patent document.

FIG. 6 is a drawing of timing diagrams for the register 100 as described in various representative embodiments of the present patent document. In FIG. 6, the top diagram shows the reference clock signal 110 plotted on the vertical axis vs. time on the horizontal axis. One cycle of the reference clock signal 110 starts at time $t_{R0}$ with a transition from its low value to its high value, transitions back to its low value at time $t_{RM}$, and ends its cycle at time $t_{RE}$ just at the repeat of the transition from its low value to its high value. In the example of FIG. 6, it has been assumed, for illustrative purposes, that the reference clock signal 110, as shown in the top diagram of FIG. 6, and the data signal 145, as shown in the first diagram below the top diagram of FIG. 6, experience different delays in arriving at the register 100 and that the delay circuit 125 introduces the first delay time 165 into the system. The delayed data signal 150 then is edge aligned with the reference clock signal 110 as shown by the top diagram of FIG. 6 and by the second diagram below the top diagram in FIG. 6. The data signal 145, as does the delayed data signal 150, comprises two bits of data during the one clock cycle shown which for this example is a one as indicated by the high value between $t_{R0}$ and $t_{RM}$ and a zero as indicated by the low value between $t_{RM}$ and $t_{RE}$. The bottom diagram shows the delayed clock signal 115 plotted on the vertical axis vs. time on the horizontal axis. For this typical application, the second delay time 120 is equal to one-quarter of the clock period ($t_{RE}-t_{R0}$). So, the delayed clock signal 115 is the same as the reference clock signal 110 delayed by one-quarter of the clock period. Transition from one data state to another in the register cell 130 is enabled at the leading and trailing transitions of the delayed clock signal 115 which occurs at times ($t_{S0}+t_{CD}$) and ($t_{SM}+t_{CD}$). At times $t_1$ and $t_2$ the delayed data signal 115 is sufficiently removed in time from its transition times that the delayed data signal 115 is a relatively solid value for the register cell 130 to detect.

5. Concluding Remarks:

As is the case, in many data-processing products, the register 100 may be implemented in hardware using a variety of known methods and processes. In addition, the register 100 can be implemented as a single register latching on both edges of the delayed clock signal 115 or as two registers with one latching on the rising edge and one on the falling edge of the delayed clock signal 115. Moreover, the controller 140 can be implemented by a variety of known methods, using analog and/or digital components. In addition, the delay circuit 125 can also be implemented using a number of known methods and using both analog and/or digital components while employing one or more stages of delay. The invention is not limited to the techniques of the double data rate applications as described in the representative embodiments disclosed herein. Techniques describe herein can be used with single data rate applications and with applications having multiple values encoded onto the single data lines among others.

A primary advantage of the embodiment as described in the present patent document over prior registers 100 in source synchronous I/O for parallel bus systems is that data rates can be greatly increased. In these parallel transmission systems some fixed mismatch always remains between the various input/output parallel paths with an associated limit in attainable data rates due to variations in board trace length differences, package trace length differences, on-chip clock routing differences, clock skew, and the like. In addition, processing variations can cause changes in clock timing, data bit transition levels, and other rate related parameters all of which slow the rate at which data can be reliably transmitted. In representative embodiments, the present patent document discloses self calibrating register 100 which is capable of adjusting out these time differences.

While the present invention has been described in detail in relation to preferred embodiments thereof, the described embodiments have been presented by way of example and not by way of limitation. It will be understood by those skilled in the art that various changes maybe made in the form and details of the described embodiments resulting in equivalent embodiments that remain within the scope of the appended claims.

What is claimed is:

1. A register for storing data, which comprises:
   a delay circuit, wherein the delay circuit is configured to receive a data signal, and to transmit a delayed data signal and wherein the delayed data signal is the data signal delayed by a first delay time; and
   a register cell, wherein the register cell is configured to receive the delayed data signal transmitted by the delay circuit and a delayed clock signal, wherein the delayed clock signal is obtained by delaying a reference clock signal by a second delay time, and wherein the register cell is configured to store the delayed data signal upon enablement by the delayed clock signal.

2. The register as recited in claim 1, wherein the second delay time is substantially equal to one-quarter of the clock period.

3. The register as recited in claim 1, wherein the register is configured to operate in a source synchronous parallel bus system.

4. The register as recited in claim 1, further comprising:
   a controller, wherein the controller is configured to program the first delay time into the delay circuit via a control signal.

5. The register as recited in claim 4, wherein the second time delay is substantially equal to one-quarter of the clock period.

6. The register as recited in claim 4, wherein the register is configured to operate in a source synchronous parallel bus system.

7. The register as recited in claim 1, further comprising:
   a phase detector, wherein the phase detector is configured to receive the reference clock signal and the delayed data signal, wherein the phase detector is configured to output a phase shift signal, and wherein the phase shift signal comprises information regarding the phase difference between the reference clock signal and the delayed data signal; and
   a controller, wherein the controller is configured to receive the phase shift signal from the phase detector, wherein the controller is configured to output a control signal, wherein the delay circuit is configured to receive the control signal, and wherein the delay circuit is configured so that the control signal adjusts the first delay time iteratively until the reference clock signal and the delayed data signal are edge aligned.

8. The register as recited in claim 7, wherein the second time delay is substantially equal to one-quarter of the clock period.

9. The register as recited in claim 7, wherein the register is configured to operate in a source synchronous parallel bus system.

* * * * *